United States Patent [19]
Havemann et al.

[11] Patent Number: 5,786,624
[45] Date of Patent: Jul. 28, 1998

[54] DUAL MASKING FOR SELECTIVE GAP FILL OF SUBMICRON INTERCONNECTS

[75] Inventors: Robert H. Havemann, Garland; Richard A. Stoltz, Plano, both of Tex.

[73] Assignee: Texas Instruments Incorporated, Dallas, Tex.

[21] Appl. No.: 803,847

[22] Filed: Feb. 28, 1997

Related U.S. Application Data

[60] Continuation of Ser. No. 472,203, Jun. 7, 1995, abandoned, which is a division of Ser. No. 255,198, Jun. 7, 1994, abandoned.

[51] Int. Cl.$^6$ .................................................. H01L 29/06
[52] U.S. Cl. .............................................. 257/635; 257/638
[58] Field of Search .................................. 257/638, 643, 257/642, 635, 759, 760, 773, 775

[56] References Cited

U.S. PATENT DOCUMENTS

| | | | |
|---|---|---|---|
| 4,584,079 | 4/1986 | Lee et al. | 204/192.25 |
| 4,986,878 | 1/1991 | Malazgiri et al. | 156/643.1 |
| 5,004,704 | 4/1991 | Maeda et al. | 437/195 |
| 5,077,234 | 12/1991 | Scoopo et al. | 437/67 |
| 5,103,288 | 4/1992 | Sakamato et al. | 257/632 |
| 5,166,101 | 11/1992 | Lee et al. | 437/238 |
| 5,272,117 | 12/1993 | Roth et al. | 437/228 |
| 5,278,103 | 1/1994 | Mallon et al. | 437/240 |
| 5,324,683 | 6/1994 | Fitch et al. | 437/65 |
| 5,356,513 | 10/1994 | Burke et al. | 156/636.1 |

FOREIGN PATENT DOCUMENTS

| | | |
|---|---|---|
| 0 089 559 A2 | 9/1983 | European Pat. Off. . |
| 0 365 854 A2 | 5/1990 | European Pat. Off. . |
| 0 411 795 A1 | 2/1991 | European Pat. Off. . |
| 0502614A2 | 9/1992 | European Pat. Off. . |
| 0 537 001 A1 | 4/1993 | European Pat. Off. . |
| 63-179548 | 7/1988 | Japan . |

*Primary Examiner*—Jerome Jackson
*Attorney, Agent, or Firm*—Kay Houston; W. James Brady, III; Richard L. Donaldson

[57] ABSTRACT

A semiconductor device and method having a low-permittivity material between closely-spaced leads in order to decrease unwanted capacitance, while having a more structurally strong dielectric between widely-spaced leads where capacitance is not as critical. A metal layer 14 is deposited on a substrate 12 of a semiconductor wafer 10, where the metal layer 14 has a first region 15 and a second region 17. An insulating layer 39 is deposited on the metal layer, and the insulating layer 39 is patterned with a conductor pattern of widely-spaced leads and closely-spaced leads. Widely-spaced leads 16 are formed in the first region 15 of the metal layer 14. At least adjacent portions of closely-spaced leads 18 are formed in the second region 17 of the metal layer 14. A low-permittivity material 34 is deposited between adjacent portions of the closely-spaced leads 18. A structural dielectric layer 26 is deposited between at least the widely-spaced leads. The low-permittivity material 34 is a material with a dielectric constant of less than 3. An advantage of the invention includes improved structural strength by placing structurally weak low-permittivity material only where needed, in areas having closely-spaced leads.

15 Claims, 6 Drawing Sheets

5,786,624

DUAL MASKING FOR SELECTIVE GAP FILL OF SUBMICRON INTERCONNECTS

This is a continuation of application Ser. No. 08/472,203, filed Jun. 7, 1995 (now abandoned); which is division of application Ser. No. 08/255,198, filed Jun. 7, 1994 (now abandoned).

The following co-assigned U.S. patent applications are hereby incorporated herein by reference:

FIELD OF THE INVENTION

This invention relates generally to the fabrication of semiconductor devices, and more specifically to the patterning of metallic interconnect layers having submicron spacing and using low-permittivity materials between leads.

BACKGROUND OF THE INVENTION

Semiconductors are widely used in integrated circuits for electronic applications, including radios and televisions. Such integrated circuits typically use multiple transistors fabricated in single crystal silicon. Many integrated circuits now contain multiple levels of metallization for interconnections. As geometries shrink and functional density increases, it becomes imperative to reduce the RC time constant within multi-level metallization systems

SUMMARY OF THE INVENTION

Although the dielectric typically used in the past to electrically insulate metal lines from each other was silicon dioxide, recent trends have been towards using materials with low-dielectric constants in order to reduce the RC time constant Many low-dielectric insulators are either pure polymers (e.g. parylene, teflon, polyimide) or organic spin-on glass (OSOG, e.g. silsequioxane and siloxane glass). The structural strength and/or mechanical stability of these low-permittivity materials, particularly at the elevated temperatures (greater than 400° C.) used in today's processing, is generally poorer than that of silicon dioxide.

Thus, the use of low-permittivity materials in the semiconductor industry has resulted in a need for a method of increasing the structural support of interconnects on a semiconductor wafer. A semiconductor device and method is disclosed herein that solves this problem in a novel fashion. Low-permittivity materials are used only in areas having closely-spaced leads, decreasing unwanted capacitance between closely-spaced leads, while traditional dielectric materials are used elsewhere, providing strong structural support.

One embodiment of the present invention encompasses depositing a metal layer on a substrate of a semiconductor wafer, where the metal layer has a first region and a second region. An insulating layer is deposited on the metal layer, and the insulating layer is patterned with a conductor pattern of widely-spaced leads and closely-spaced leads. Widely-spaced leads are formed in the first region of the metal layer, where the widely-spaced leads have leads spaced apart by more than one and one-half the minimum lead spacing. At least adjacent portions of closely-spaced leads are formed in the second region of the metal layer, where the closely-spaced leads have leads spaced apart less than or equal to one and one-half the minimum leads spacing. A low-permittivity material is deposited between adjacent portions of the closely-spaced leads. A structural dielectric layer is deposited between at least the widely-spaced leads. The low-permittivity material is a material with a dielectric constant of less than 3.

Another embodiment of the present invention includes depositing a metal layer on a substrate. The metal layer has a first region and a second region. An insulating layer is deposited on the metal layer, and a resist layer is deposited on the insulating layer. The resist layer is patterned to form a conductor pattern of widely-spaced leads and closely-spaced leads on the insulating layer. The resist layer is removed. Then the wafer is etched to form at least widely-spaced leads in the first region of the metal layer and at least adjacent portions of closely-spaced leads in the second region of the metal layer. A low-permittivity material is deposited between at least adjacent portions of the closely-spaced leads. A structural dielectric layer is then deposited between at least the widely-spaced leads.

Yet another embodiment of the present invention includes depositing a metal layer on a substrate, the metal layer having a first region and a second region. An insulating layer is deposited on the metal layer, and a first resist is deposited on the insulating layer. The first resist is patterned to form a conductor pattern on the insulating layer, and the first resist is removed. The second region of the metal layer is covered with a second resist. The first region of the metal layer is etched to form widely-spaced leads. A first structural dielectric layer is deposited on at least the widely-spaced leads. The second resist is removed to expose the second region of the metal layer. The second region of the metal layer is etched to form at least adjacent portions of closely-spaced leads in the second region of the metal layer. A low-permittivity material is deposited between at least the closely-spaced leads. A second structural dielectric layer is deposited over at least the widely-spaced leads.

A further embodiment includes a semiconductor device structure comprising a substrate having a first region and a second region. Widely-spaced leads are formed on the first region of the substrate, with a first structural dielectric layer between the widely-spaced leads. Adjacent portions of closely-spaced leads are formed on the second region of the substrate, with a low-permittivity material between the closely-spaced leads. A single homogeneous structural dielectric layer is deposited over the low-permittivity material and over and between the widely-spaced leads.

An advantage of the invention includes improved structural strength by placing structurally weak low-permittivity material only where needed, in areas having closely-spaced leads.

A further advantage of the invention includes a reduction in fringing capacitance of closely-spaced metal leads. A first structural dielectric layer or etch-stop dielectric layer resides on the metal leads, which results in an increased height of the low-permittivity material on closely-spaced metal leads. This allows the low-permittivity material to extend beyond the top of the metal leads, providing for an increase in process margin.

Another advantage of the invention is that vias to underlying metal leads may be formed through a structurally sound and high quality dielectric material, so that traditional via formation processes can be utilized.

A further advantage is a single homogeneous structural dielectric layer deposited over the widely-spaced leads and the low-permittivity material.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

Figure 1A:
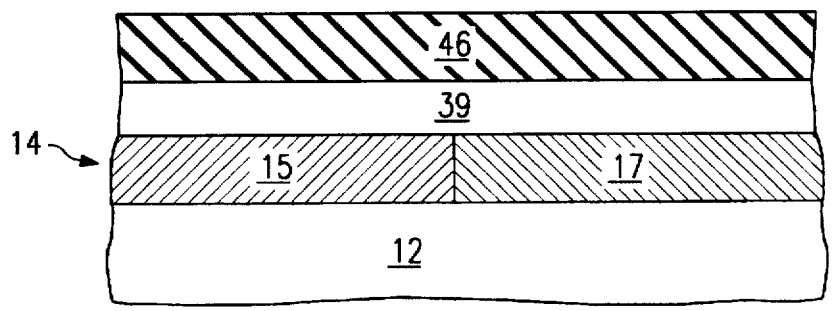
FIGS. 1A–1E, and 2A–2D show cross-sections of a portion of a semiconductor device, illustrating a first embodiment of the invention.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including manufacturing methods. Corresponding numerals and symbols in the different figures refer to corresponding parts unless otherwise indicated. Table 1 below provides an overview of the elements of the embodiments and the drawings.

TABLE 1

| Drawing Element | Preferred or Specific Examples | Generic Term | Other Alternate Examples or Descriptions |
| --- | --- | --- | --- |
| 10 | | Semiconductor wafer | |
| 12 | Silicon oxide over single-crystal silicon | Substrate | May include other metal layers or other semiconductor elements, (e.g. transistors, diodes); Compound semiconductors (e.g. GaAs, InP, Si/Ge, SiC) may be used in place of Si. |
| 14 | Aluminum alloy | Metal layer | Trilayer of TiN/AlCu/TiN; Alloys of Al, Cu, Mo, W, Ti, Si; Polysilicon, silicides, nitrides, carbides; AlCu alloy with Ti or TiN underlayers; Metal layer. |
| 15 | | First region of metal layer 14 | First region of metal layer 14 where widely-spaced leads 16 will be formed |
| 16 | | Widely-spaced leads | |
| 17 | | Second region of metal layer 14 | Second region of metal layer 14 where adjacent portions of closely-spaced leads 18 will be formed |
| 18 | | Closely-spaced leads | |
| 26 | $SiO_2$ | First structural dielectric layer | Oxide, nitride, dense glass, solid inorganic, solid organic, other suitable rigid dielectric; oxide. |
| 34 | Parylene | Low-permittivity material | Other polymer dielectrics such as teflon and polyimide; aerogel; airgap (inert gases or vacuum). |
| 36 | PETEOS (Plasma-enhanced tetra-ethoxysilane) | Second structural dielectric layer | Silsesquioxane; SOG (spin-on glass); other oxides. |
| 38 | PETEOS | Passivating layer | Oxide or nitride layer |
| 39 | Silicon nitride/silicon dioxide | Etch-stopping dielectric layer | Silicon dioxide, "Insulating layer," PETEOS. |
| 44 | | First reticle | Contains patterns for both widely- and closely-spaced leads. |
| 46 | | First resist layer | Photoresist |
| 48 | | Exposed portions of first resist layer | |
| 50 | Photoresist | Second resist layer | Photo-sensitive polyimide |

TABLE 1-continued

| Drawing Element | Preferred or Specific Examples | Generic Term | Other Alternate Examples or Descriptions |
| --- | --- | --- | --- |
| 52 | PETEOS | Hard oxide mask | Nitride |

FIGS. 1–2 show a first embodiment of the present invention. FIG. 1A shows a simiconductor wafer 10 that has a substrate 12 which may, for example, contain transistors, diodes, and other semiconductor elements (not shown) as are well known in the art. Semiconductor wafer 10 may also contain metal layers. Metal layer 14 has been deposited over the substrate 12. Metal layer 14 may comprise, for example, an aluminum alloy or a titanium-tungsten/aluminum alloy bilayer and is typically from 0.5 to 2 µm thick. Metal layer 14 has been divided into two sections; a first region 15 where widely-spaced leads 16 will be formed, and a second region 17 where at least adjacent portions of closely-spaced leads 18 will be formed.

A single lead may have portions that are both closely-spaced and widely-spaced. For this case, at least two alternative methods of blocking off the areas where closely-spaced leads will be formed are available. One method is to mask only the portions of the lead that are adjacent another lead (adjacent portion). Alternately, the entire closely-spaced lead can be blocked, for a lead having at least a portion that is closely-spaced. For discussion, it is convenient to talk only of "widely-spaced leads" and "adjacent portions", the adjacent portions being of closely-spaced leads (at least some of which leads may also have portions which are not adjacent to other leads). It should be understood that the non-adjacent portions of closely-spaced leads may be processed with either the "adjacent portions" or the "widely-spaced leads".

Etch-stopping dielectric layer 39 is deposited over metal layer 14. A first resist layer 46 is then deposited over etch-stopping dielectric layer 39. The first resist layer 46 is preferably comprised of photoresist, or other resists such as photosensitive polyimide may be used.

Figure 1B:
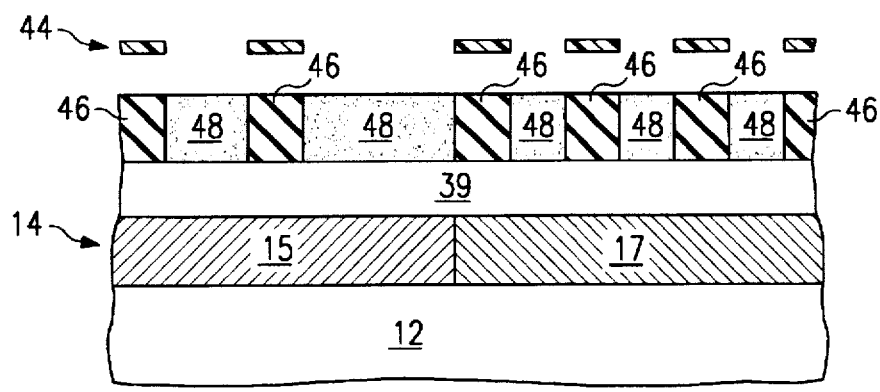
Figure 1C:
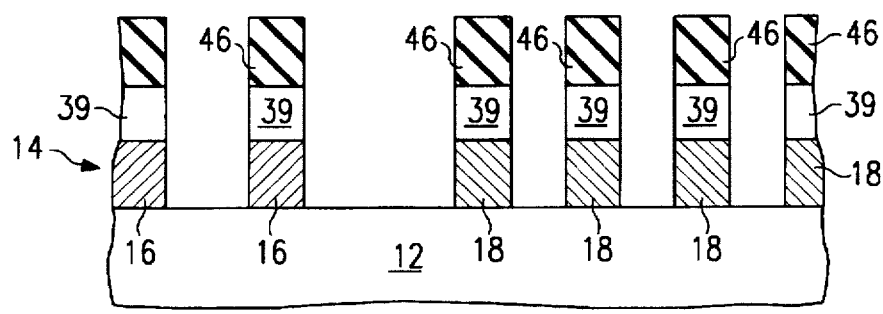

The wafer 10 is masked with the first reticle 44, which contains the conductor pattern (as all conductors of this layer are patterned at one time, alignment problems are generally avoided, even if all conductors are not etched at the same time, or if two portions of a single conductor are etched at different times; preferably, however, all portions of all conductors are etched together). The first reticle 44 is configured such that both widely-spaced and all portions of closely-spaced leads are patterned at the same time. Uncovered portions of the first resist layer 46 are exposed as shown in FIG. 1B. Exposed portions 48 of the first resist layer are developed and removed. Etch-stopping dielectric layer 39 and metal layer 14 are etched, typically in separate steps (FIG. 1C), to form widely-spaced leads 16 and closely-spaced leads 18.

Widely-spaced leads 16 typically have a spacing aspect ratio of less than one (the spacing aspect ratio is the height of the metal leads compared to [i.e. divided by] the space between leads). Generally, the widely-spaced leads 16 are spaced apart at distances typically one and one-half the minimum lead-to-lead spacing or greater. The spaces between such widely-spaced leads 16 are sufficient to prevent excessive capacitive effects, and thus do not require low-permittivity materials for isolation.

Closely-spaced leads 18 typically have a spacing aspect ratio in the range of greater than or equal to one. Generally, closely-spaced leads 18 are spaced apart at distances typically less than one µm, and the spacing can be the same as the minimum lead (conductor) width. The spaces between the leads are close enough together to have significant parasitic capacitance, and thus the structure benefits from the low-permittivity material 34 between the closely-spaced leads 18.

Figure 1D:
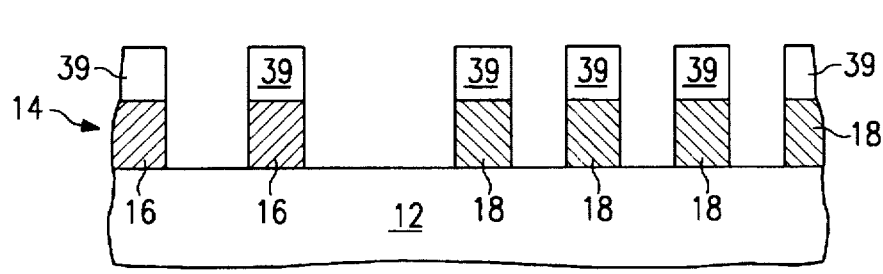
Figure 1E:
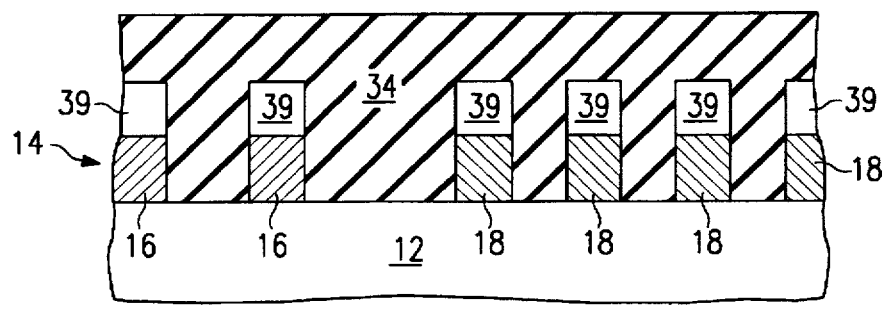

The first resist layer 46 is then stripped (FIG. 1D). Low-permittivity material 34 is applied over the entire wafer 10 (FIG. 1E) and may be planarized. The low-permittivity material 34 is comprised of a material having a low-dielectric constant, preferably a polymer dielectric such as parylene or teflon with a dielectric constant of less than approximately 3.

Figure 2A:
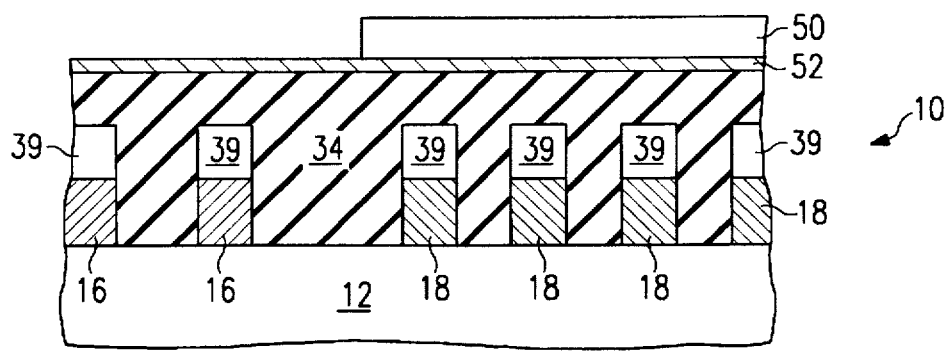
Figure 2B:
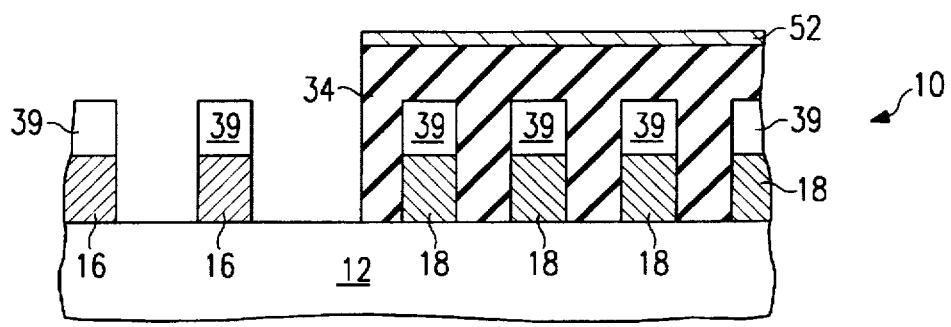
Figure 2C:
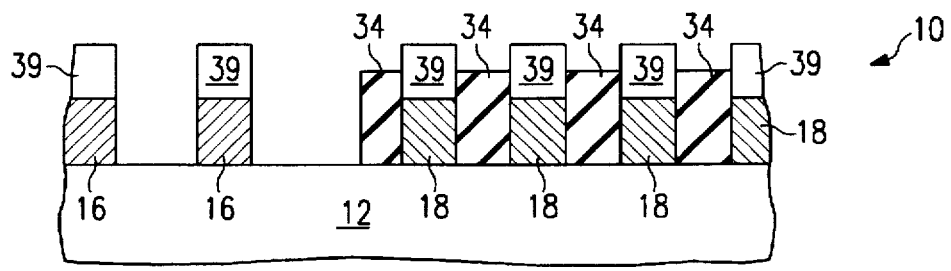
Figure 2D:
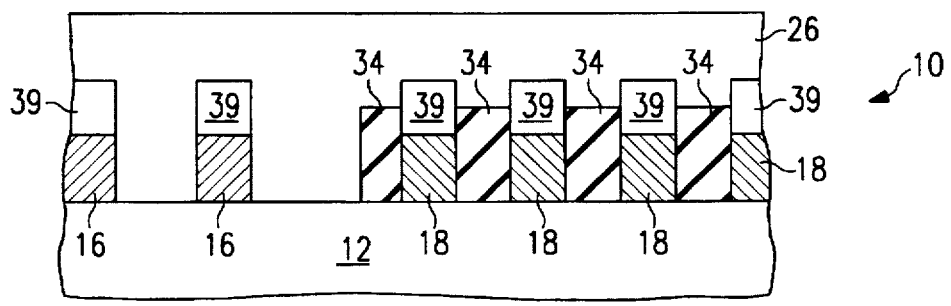

A thin hard oxide mask 52 is applied over the low-permittivity material 34 (FIG. 2A). A second resist layer 50 is applied over the hard oxide mask 52, and is exposed (through second reticle, not shown), and removed, from areas containing the widely-spaced leads 16 (FIG. 2A). The hard oxide mask 52 and low-permittivity material 34 are removed from areas containing the widely-spaced leads 16 (FIG. 2B), but remain on areas of the wafer containing the closely-spaced leads 18. Next, the hard oxide mask 52 is removed from areas containing the closely-spaced leads 18 and the low-permittivity material 34 is removed (e.g. etched back) to a level at or below the top of the etch-stopping dielectric layer 39 (FIG. 2C) on the metal leads. Etch-stopping dielectric layer 39 serves as an etch stop for the low-permittivity dielectric layer 34 etchant. Preferably, the low-permittivity material 34 is not etched down past the top of the closely-spaced metal leads 18. Preferably, the low-permittivity material 34 lies a distance equal to 30–50% the thickness of the metal lead 18 above the tops of the closely-spaced metal leads 18, to eliminate or reduce the fringing capacitance between metal leads 18 at the corners and tops of closely-spaced metal leads 18. The reduction of fringing capacitance is an advantage of the invention, which is a result of the increased height of the low-permittivity material 34, which may extend beyond the top of the closely-spaced metal leads 18. Then, first structural dielectric layer 26 is deposited over the entire wafer 10 and may be planarized (FIG. 2D). An advantage of the first embodiment is that the entire wafer is coated with a single homogeneous layer (the first structural dielectric layer 26).

A second embodiment is shown in FIGS. 3–5. FIG. 3A shows a semiconductor wafer 10 that has a substrate 12, and a metal layer 14 deposited over the substrate 12. The metal layer 14 has two sections; a first region 15 where widely-spaced leads will be formed, and a second region 17 where closely-spaced leads will be formed. Etch-stopping dielectric layer 39 is deposited over metal layer 14. A first resist layer 46 is then deposited over etch-stopping dielectric layer 39. The first resist layer 46 is preferably comprised of photoresist, or other resist such as photosensitive polyimide may be used.

Figure 3A:
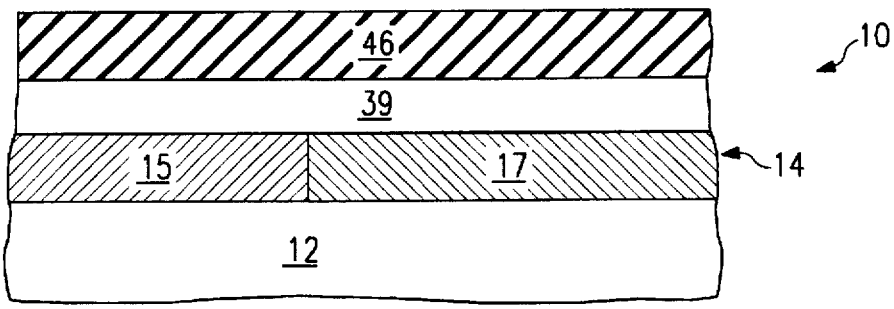
FIGS. 3A–3D, 4A–4D, and 5A–5C show cross-sections of a portion of a semiconductor device, illustrating a second embodiment of the invention.
Figure 3B:
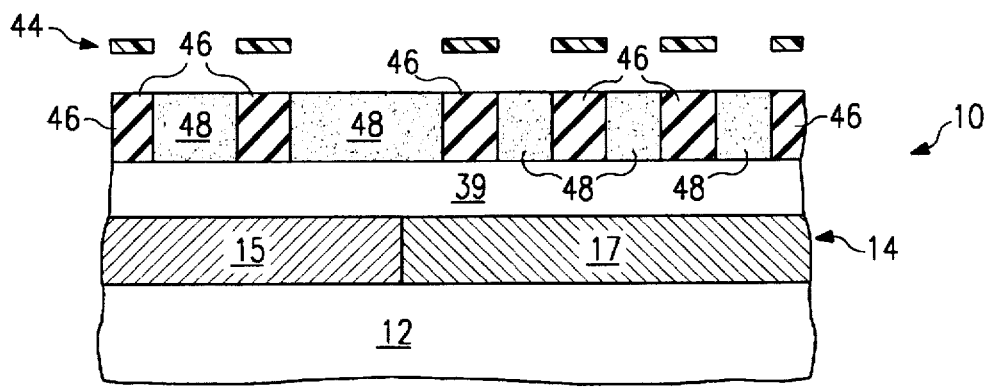
Figure 3C:
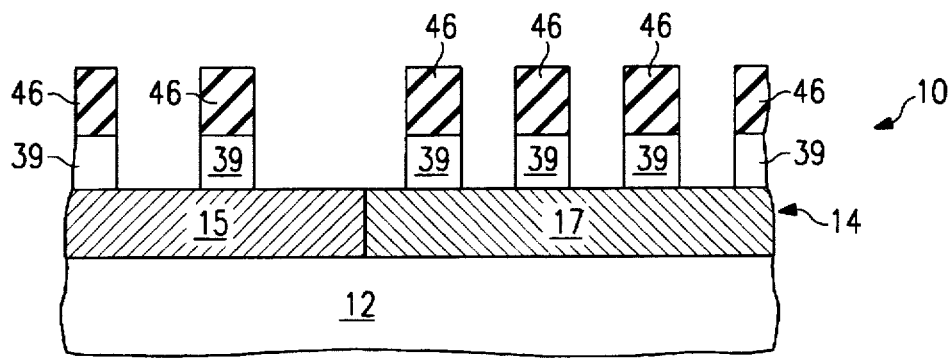
Figure 3D:
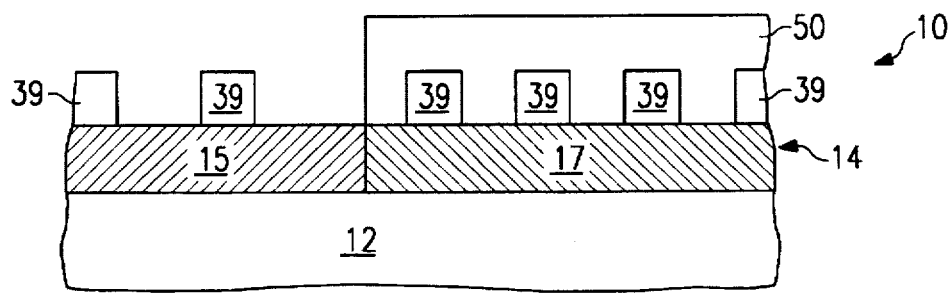

The wafer 10 is masked with the first reticle 44, which contains the conductor pattern for both widely-spaced and closely-spaced leads. Uncovered portions of the first resist layer 46 are exposed as shown in FIG. 3B. Exposed portions 48 of the first resist layer 46 are developed and removed, and the etch-stopping dielectric layer 39 is etched (FIG. 3C). The wafer 10 is covered with a second resist layer, 50 which is preferably comprised of photosensitive polyimide, but possibly a photoresist. The second resist layer is exposed (through a second reticle, not shown) in a pattern so that the second region 17 of metal layer 14 remains covered with second resist layer 50 (FIG. 3D).

Figure 4A:
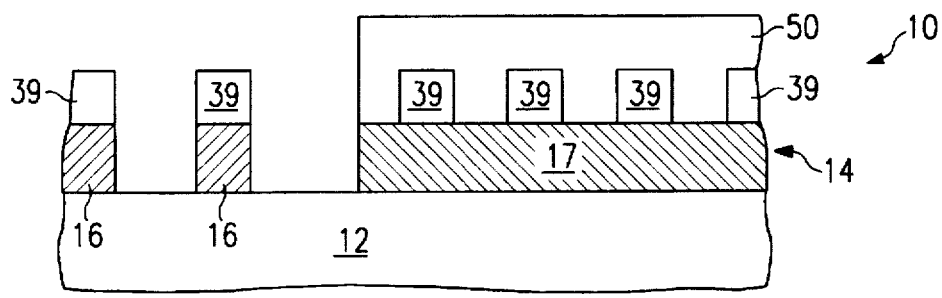
Figure 4B:
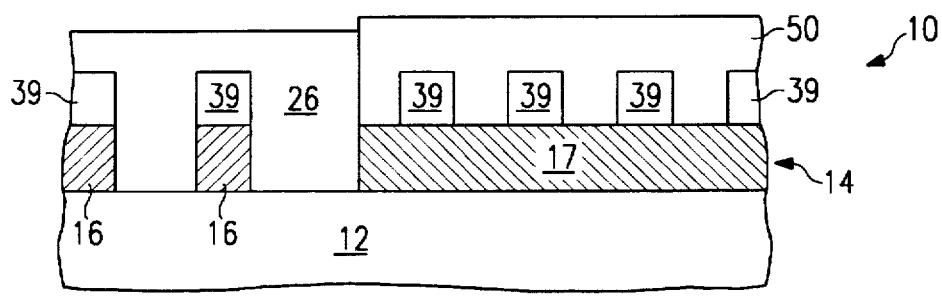
Figure 4C:
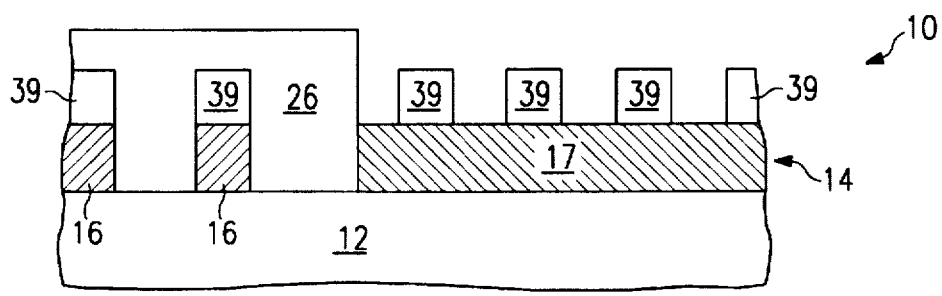
Figure 4D:
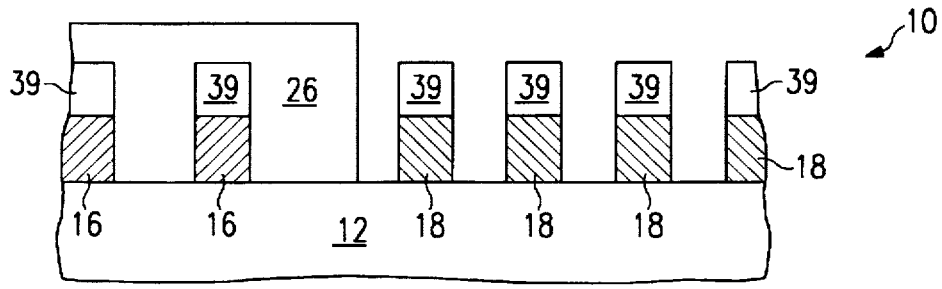
Figure 5A:
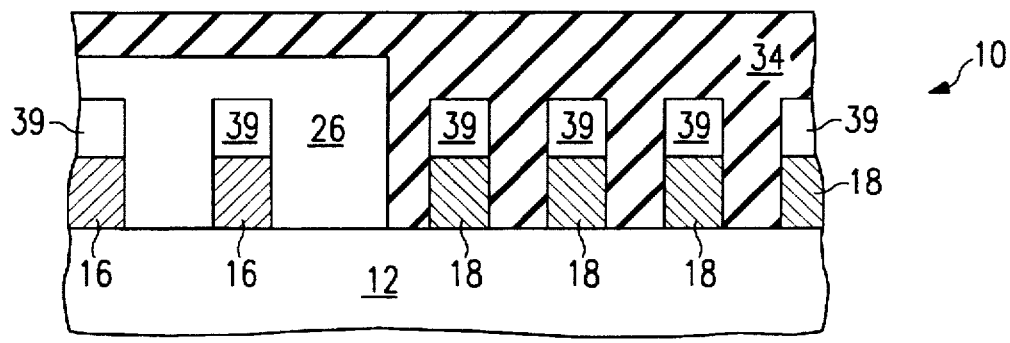

The metal layer 14 is etched to form widely-spaced metal leads 16 (FIG. 4A). First structural dielectric layer 26 is deposited over the entire wafer 10 (generally, but not shown, over the patterned resist 50 as well and then removed from at least the top of second resist layer 50) to give the structure of FIG. 4B. At this point, widely-spaced leads 16 have been formed, while the second region 17 of metal layer 14 remains unetched and also remains covered by second resist layer 50. Then the second resist layer 50 is removed from second region 17 of metal layer 14, which remains coated with the patterned etch-stopping dielectric layer 39. Metal layer 14 is etched to form closely-spaced leads 18 as shown in FIG. 4D.

Figure 5B:
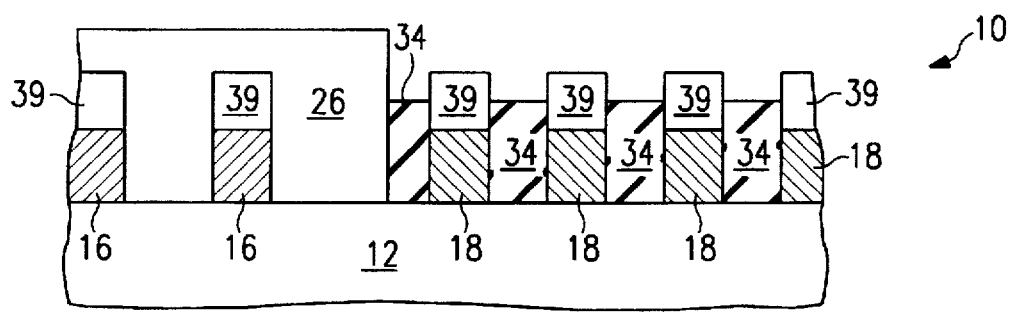
Figure 5C:
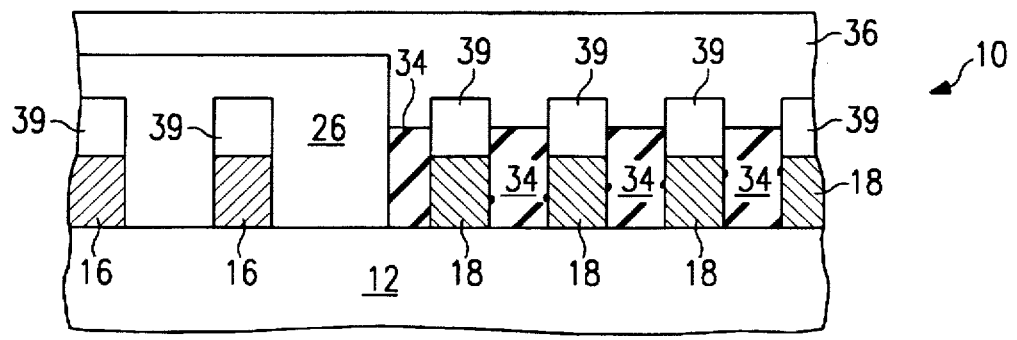

Next, low-permittivity material 34 is applied over the entire wafer 10 (FIG. 5A) and removed (e.g. etched back, for example, with a timed etch) to a level at or below the top of etch-stopping dielectric layer 39 on closely-spaced leads 18 (FIG. 5B). As in the first embodiment, the low-permittivity material 34 preferably lies a distance equal to 30–50% the thickness of the metal lead 18 above the tops of the closely-spaced metal leads 18, to eliminate or reduce the fringing capacitance between metal leads 18 at the corners and tops of closely-spaced metal leads 18. Finally, second structural dielectric layer 36 is deposited over the etch-stopping dielectric layer 39 above closely-spaced metal leads 18, low-permittivity material 34 and possibly over first structural dielectric layer 26 as shown in FIG. 5C. Preferably, PETEOS (plasma-enhanced tetraethoxysilane) is used for the second structural dielectric layer 36.

Typically, for this invention, first structural dielectric layer 26 and second structural dielectric layer 36 are comprised of an oxide and etch-stopping dielectric layer 39 is comprised of a low-dielectric constant OSOG having a dielectric constant of less than 3. However, other combinations of materials can be used. For example, etch-stopping dielectric layer 39 may be comprised of an oxide, while the first and second structural dielectric layers 26 and 36 can both be Teflon or parylene. The latter combination may be especially compatible with low-permittivity materials 34 comprising aerogel or xerogel.

Figure 6A:
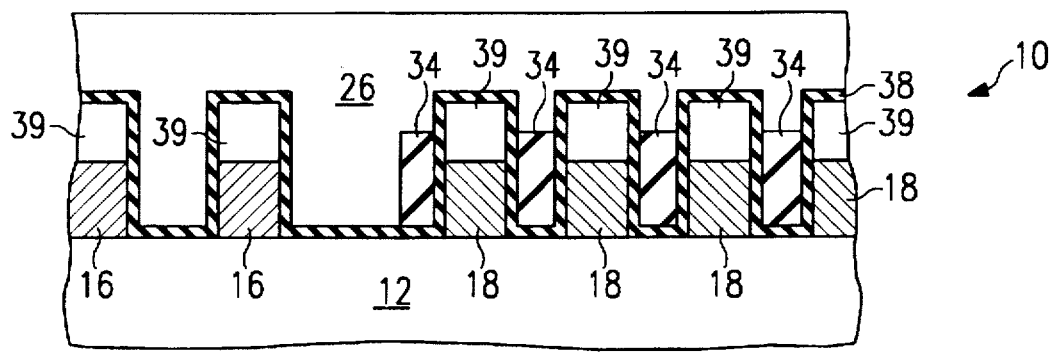
FIGS. 6A–6B show cross-sections of two embodiments of the invention, with the added feature of a passivating layer deposited over the metal leads.
Figure 6B:
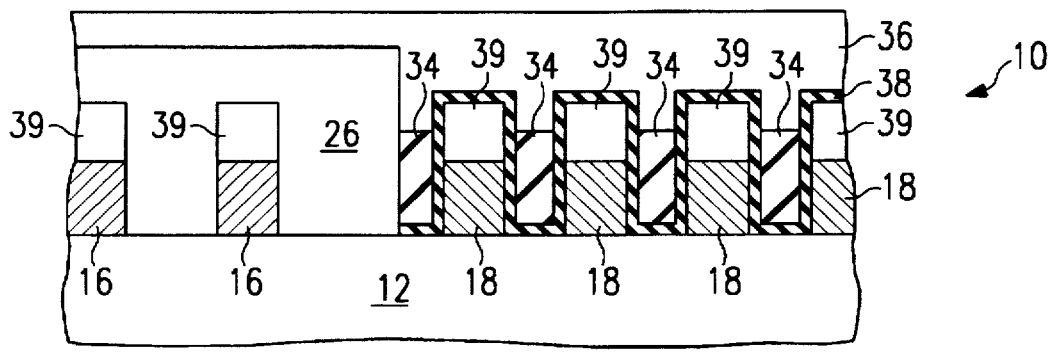

FIG. 6A shows an alternate for the first embodiment, in which, after the step shown in FIG. 1D, a passivating layer 38 is formed on exposed portions of etch-stopping dielectric layer 39, sidewalls of widely-spaced leads 16 and closely-spaced metal leads 18, and the substrate 12. This passivating layer 38 is particularly beneficial to closely-spaced leads 18 because it prevents reaction between the metal leads 18 and the low-permittivity material 34. Similarly, an alternate for the second embodiment is shown in FIG. 6B, where, after the step shown in FIG. 4D, a passivating layer 38 is formed on exposed portions of etch-stopping dielectric layer 39, sidewalls of closely-spaced metal leads 18, and the substrate 12.

Although the process of FIGS. 1A–1E and 2A–2D is generally preferred, alternate processes (not shown) can be used to achieve essentially the same results. For example, starting with the configuration of FIG. 1D (after all leads on this layer have been patterned), one can utilize resist in the inverse of the pattern 50 (thus leaving resist covering the widely-spaced leads), deposit the low-permittivity material, planarize to expose etch-stopping dielectric layer 39, remove the resist to give the configuration of FIG. 2C, and then deposit the structural dielectric to give the structure of FIG. 2D.

As another example, starting again with the configuration of FIG. 1D (after all leads on this layer have been patterned), one can deposit a first layer of structural dielectric, utilize resist in the inverse of the pattern 50, etch the structural dielectric, remove the resist, deposit the low-permittivity material, planarize to expose etch-stopping dielectric layer 39, (e.g. with a timed etch or chemical mechanical polishing) and then deposit a second layer of the structural dielectric to give the structure of FIG. 5C.

As still another example, starting again with the configuration of FIG. 1D (after all leads on this layer have been patterned), one can utilize resist in the pattern 50, deposit a first layer of structural dielectric, planarize to expose etch-stopping dielectric layer 39, remove the resist, deposit the low-permittivity material, again planarize to expose etch-stopping dielectric layer 39, and then deposit a second layer of the structural dielectric.

As yet another example, starting with the configuration of FIG. 3C, (after the etch-stopping dielectric layer 39 has been patterned), one can utilize resist in the inverse of the pattern 50 and etch the adjacent portions, deposit the low-permittivity material, planarize to expose etch-stopping dielectric layer 39, remove the resist, etch the widely-spaced leads 16, and deposit the structural dielectric to give the structure of FIG. 2D.

The present invention generally utilizes a "delineation" pattern resist to delineate at least regions of widely-spaced leads from at least regions of adjacent portions of closely-spaced leads, and thus to allow deposition of low-permittivity material at least in regions of adjacent portions of closely-spaced leads and to allow deposition of structural dielectric at least in regions of widely-spaced leads. Again, non-adjacent portions of closely-spaced leads may be processed with either the "adjacent portions" or the "widely-spaced leads". While this "delineation" pattern requires an additional masking step (one in addition to the conventional conductor patterning mask), the alignment of this additional masking step is not critical and thus no extra real estate is required for alignment tolerances. To further avoid alignment problems, this invention generally provides for the determination of the conductor pattern in a single masking step (although it is not preferred, the widely-spaced leads may, however, be etched separately from at least the adjacent portions of closely-spaced leads).

The novel method of dual masking for selective gap fill of submicron interconnects offers definite advantages over the conventional processes. First, the structurally weak low-permittivity material is limited to areas that benefit from it. In the areas where low-permittivity material is not needed, the structural dielectric layer provides more structural support. The result is an overall stronger structure, with better heat transfer capability (since the heat transfer of low-permittivity materials is generally poor). In the first embodiment, the structural dielectric is a single homogeneous layer, which is a further advantage.

Second, the first embodiment provides for patterning the entire metal layer at once, eliminating the possible alignment issues of the second embodiment. The second reticle that patterns the second resist to mask the closely-spaced leads can be relatively easily generated from the first reticle for the metal layer. Thus, the implementation of the first embodiment may be easier into current process flows.

Third, the etch-stopping dielectric layer 39 on top of closely-spaced leads 18 has the additional advantage of reducing fringing capacitance between closely-spaced leads 18. The etch-stopping dielectric layer 39 allows for an increased height of the low-permittivity material 34 between closely-spaced leads 18, enabling the low-permittivity material to extend beyond the top of the metal leads. This provides for an increase in process margin.

A fourth advantage of the invention is that vias to underlying metal leads may be formed through a structurally sound and high quality dielectric (the etch-stopping dielectric layer 39 on top of closely-spaced leads 18) so that traditional via formation processes can be utilized.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a substrate,
   a first metal layer formed on said substrate, said first metal layer having a first region and a second region;
   widely-spaced leads formed in said first region of said first metal layer, said widely-spaced leads spaced apart by more than one and one-half a minimum lead spacing;
   adjacent portions of closely-spaced leads formed in said second region of said first metal layer, said adjacent portions being spaced apart less than or equal to one and one-half a minimum lead spacing, said closely-spaced leads having a height and tops;
   a first insulating material between at least portions of said closely-spaced leads, said portions being spaced from another portion by less than one and one-half the minimum lead spacing, said first insulating material providing a dielectric constant of less than 3 in a region between at least two of said closely-spaced leads; and
   a third insulating material over said first insulating material and over and between said widely-spaced leads, wherein said third insulating material is a single homogeneous structural dielectric layer and wherein said third insulating material is structurally stronger than said first insulating material.

2. The structure of claim 1 further comprising a second insulating material on at least said tops of said closely-spaced leads, said second insulating material having a height above said tops of said close-spaced leads.

3. The structure of claim 1 wherein said first insulating material has a height above said substrate at least equal to said height of said closely-spaced leads.

4. The structure of claim 2 wherein said first insulating material has a height above said substrate at least equal to said height of said closely-spaced leads.

5. The structure of claim 4 wherein said first insulating material has a height above said substrate equal to the height of said closely-spaced leads and at least 50% of said height above said closely-spaced leads of said second insulating material on said closely-spaced leads.

6. The structure of claim 2 wherein said closely-spaced leads have sides, further comprising a fourth insulating material over at least said second insulating material on said closely-spaced leads and said sides of said closely-spaced leads, wherein said fourth insulating material is a passivation layer.

7. The structure of claim 6 wherein said widely-spaced leads have sides and wherein said fourth insulating layer also resides on said second insulating material on said widely-spaced leads and said sides of said widely-spaced leads.

8. A semiconductor device comprising:
   a substrate,
   a first metal layer formed on said substrate, said first metal layer having a first region and a second region;
   widely-spaced leads formed in said first region of said first metal layer, said widely-spaced leads spaced apart by more than one and one-half a minimum lead spacing;
   adjacent portions of closely-spaced leads formed in said second region of said first metal layer, said adjacent portions being spaced apart less than or equal to one-half a minimum lead spacing, said closely-spaced leads having a height above said substrate and tops;
   a first insulating layer on at least said tops of said closely-spaced leads, said first insulating layer having a height above said tops of said closely-spaced leads;
   a second insulating material between at least portions of said closely-spaced leads, said portions being spaced from another portion by less than one and one-half the minimum lead spacing, said second insulating material providing a dielectric constant of less than 3 in a region between at least two of said closely-spaced leads; and
   a third insulating layer over said second insulating material and over and between said widely-spaced leads, wherein said third insulating layer is a single homogeneous structural dielectric and wherein said third insulating layer is structurally stronger than said second insulating material.

9. The structure of claim 8 wherein said second insulating material has a height above said substrate at least equal to said height of said closely-spaced leads.

10. The structure of claim 9 wherein said second insulating material has a height above said substrate equal to said height of said closely-spaced leads and at least 50% of said height of said first insulating layer on said closely-spaced leads.

11. The structure of claim 8 wherein said closely-spaced leads have sides, further comprising a fourth insulating layer over at least said first insulating layer on said closely-spaced leads and said sides of said closely-spaced leads, wherein said fourth insulating layer is a passivation layer.

12. The structure of claim 11 wherein said widely-spaced leads have sides and wherein said fourth insulating layer also resides on said first insulating layer on said widely-spaced leads and said sides of said widely-spaced leads.

13. A semiconductor device comprising:
   a substrate,
   a first metal layer formed on said substrate, said first metal layer having a first region and a second region;
   widely-spaced leads formed in said first region of said first metal layer, said widely-spaced leads spaced apart by more than one and one-half a minimum lead spacing;
   adjacent portions of closely-spaced leads formed in said second region of said first metal layer, said adjacent portions being spaced apart less than or equal to one and one-half a minimum lead spacing, said closely-spaced leads having a height, tops and sides;

a first insulating layer on at least said tops of said closely-spaced leads, said insulating layer having a height above said tops of said closely-spaced leads;

a second insulating layer over at least said first insulating layer on said closely-spaced leads and said sides of said closely-spaced leads, wherein said second insulating layer is a passivation layer;

a third insulating material between at least portions of said closely-spaced leads, said portions being spaced from another portion by less than one and one-half the minimum lead spacing, said third insulating material providing a dielectric constant of less than 3 in a region between at least two of said closely-spaced leads; and a fourth insulating layer over said third insulating material and over and between said widely-spaced leads, wherein said fourth insulating layer is a single homogeneous structural dielectric and wherein said fourth insulating layer is structurally stronger than said third insulating material.

14. The structure of claim 13 wherein said third insulating material has a height above said substrate at least equal to said height of said closely-spaced leads.

15. The structure of claim 14 wherein said third insulating material has a height equal to said height of said closely-spaced leads and at least 50% of said height of said first insulating layer on said closely-spaced leads.

* * * * *